United States Patent [19]

Bober et al.

[11] 3,978,414

[45] Aug. 31, 1976

[54] APPARATUS AND METHOD FOR TAKING THE DERIVATIVE OF A SLOWLY VARYING ELECTRICAL SIGNAL

[75] Inventors: Robert E. Bober, Framingham; Robert G. Lavallee, Ashland, both of Mass.

[73] Assignee: American Optical Corporation, Southbridge, Mass.

[22] Filed: Mar. 25, 1975

[21] Appl. No.: 561,748

[52] U.S. Cl. .............................. 328/132; 328/127; 307/230

[51] Int. Cl.[2] ........................................ H03K 3/04

[58] Field of Search ........... 328/127, 128, 132, 144, 328/119; 307/229

[56] References Cited

UNITED STATES PATENTS

| | | | |
|---|---|---|---|
| 3,435,252 | 3/1969 | Eubanks | 328/132 |
| 3,733,557 | 5/1973 | Fujinami | 328/132 |

*Primary Examiner*—Stanley D. Miller, Jr.
*Assistant Examiner*—B. P. Davis
*Attorney, Agent, or Firm*—Stephen A. Schneeberger; H. R. Berkenstock, Jr.; William C. Nealon

[57] ABSTRACT

An electrical circuit for operating upon a slowly varying input signal (on the order of one volt per minute) to provide an output signal representative of the input signal derivative. The circuitry employs at least two feedback loops, one of which is constructed similar to an integrator amplifier. One particularly useful electro-medical application of this apparatus and method lies in the measurement of osmotic fragility of red blood cells, where percentage hemolysis of the blood slowly varies as a function of tonicity of suspension of the medium in which the blood sample is suspended. In this measurement the exact point of maximum slope is important and is provided by the present invention.

9 Claims, 2 Drawing Figures

APPARATUS AND METHOD FOR TAKING THE DERIVATIVE OF A SLOWLY VARYING ELECTRICAL SIGNAL

BACKGROUND OF THE INVENTION

1. Field of the Invention

The present invention relates generally to apparatus and method for taking the derivative of an electrical signal, and more particularly to apparatus and method for providing maximum slope of a slowly varying signal representative of organic cell osmotic fragility.

2. Description of Prior Art

In general, circuitry for taking the derivative of an electrical signal is known. For example, the prior art capacitor-resistor network known as a high pass filter is used for differentiating an electrical signal to an approximation. This prior art circuit is particularly useful where "fast" signals are being operated upon since required component values and physical size are compatable with other electronic and mechanical design constraints. This prior art circuit generally does not work well with slowly varying signals, for example, signals varying less than one volt per minute over perhaps an eight minute period.

A prior art circuit for providing the derivative of a slowly varying signal uses measurements of voltage increments over a plurality of equal time intervals. Obtaining equal intervals is sometimes a serious problem. This type of circuit samples and holds each measurement for a respective interval, after which interval the stored sample is compared with the instantaneous value of the signal. The information obtained is the desired slope, $\Delta v/\Delta t$.) This circuit has limitations for slowly varying signals, similar to those being operated upon by the present invention, one of the limitations occurring near zero signal value. At this extreme, small inherent offset errors are added to the storage signal which can cause large errors in the construction of the derivative signal. Also, filtering is required to remove step transitions, and this is not wholly successful under all conditions. Moreover, during a sampling period the circuit tends to be sensitive to noise spikes.

The present invention provides apparatus and method for accurately taking a derivative of an electrical signal including a slowly varying electrical signal, without the shortcomings of the prior art. The present invention does not require the cumbersome prior art incremental measurement of signal voltage, but employs high gain operational amplifiers and other circuitry in a novel arrangement that elegantly solves prior art problems of taking a derivative of a slowly varying signal. The present invention can be used in almost any application where a derivative of a slowly varying signal is desired, and finds particular utility with electromedical apparatus for measuring osmotic fragility of red blood cells. This measurement is made over an approximate 8-minute period in certain cases. The present invention provides to a physician or other observor exact information as to when maximum rate of change of percentage hemolysis of the blood cells occurs with respect to tonicity of suspension of the medium in which the blood cells are suspended.

With regard to specific application of this circuitry in the above-identified blood analyzing apparatus, background information is presented as follows. Red blood cells, called erythrocytes, are suspended in a liquid medium of lower than isotonic salt concentration, and absorb the low tonicity liquid by osmosis through cell membranes. At some osmotic gradient determined by tonicity of the suspension medium, sufficient pressure is developed within the cells to either burst their membranes or to open numerous pores therein which release hemoglobin into the surrounding medium. This action is commonly referred to as hemolysis. It is a function of condition of cell membrane and of salt concentration (tonicity of cell suspension medium), both of which are variable. The former can be determined through the latter.

Hemolysis is induced by rendering the suspension medium hypotonic. With knowledge of condition (concentration of salt) of the suspension medium that is required to reduce or start hemolysis and that required to complete hemolysis, an indication of the condition of the cell membranes is thought to be given. This, in turn, has been interpreted to be an indication of the health of the host.

In a report by Danon et al., entitled "Simple Rapid Osmotic Fragility Test Proposed as a Routine in Blood Banks" taken from *Transfusion*, Vol. 4, Number 5 (1964), pages 339–342, it is disclosed that the osmotic fragility curve and/or its derivative curve (rate of osmotic fragility) are useful tools for determining the acceptability of stored blood for transfusions. It is in the generation of this derivative curve that the present invention finds particular use. The authors of this report suggest that these osmotic fragility curves may be useful tools for determining acceptable blood donors, and it is in connection with this aspect of blood analysis that the present invention finds outstanding utility.

Other background information pertaining to this technology may be obtained from U.S. patent application Ser. No. 499,004, filed Aug. 20, 1974 in the name of Gabriel G. Nahas, and U.S. Pat. No. 3,605,539 to M. L. Polanyi, et al. both patent properties assigned to the assignee of the present invention and both incorporated herein by reference.

SUMMARY OF THE INVENTION

The present invention relates to apparatus and method for providing an output signal which represents a derivative of a slowly-varying input signal. An electrical circuit comprises an input amplifier for receiving the input signal on a first input terminal, an output amplifier responsive to the output of the input amplifier for providing the output derivative signal, first feedback means connected between the output of the input amplifier and a second input terminal thereof, and second feedback means connected between the output of the output amplifier and the second input terminal of the input amplifier.

A further feature of the present invention employs, in the second feedback means, capacitor charging means to charge a capacitor to the voltage value of the input signal and to conduct that capacitor voltage to the second input terminal of the input amplifier.

A particularly useful electro-medical application of the foregoing apparatus of the present invention lies in the measurement of osmotic fragility of organic cells such as red blood cells.

Amongst the advantages of the present invention, one must include the salient advantage of simply and accurately providing a signal representative of the derivative of a slowly-varying input signal, varying on the order of less than 1 volt/minute over a time period of possibly 8 minutes or more. The circuitry apparatus requires few component parts and has a high common mode voltage operating range. Furthermore, the few electronic components necessary to construct the circuit of the present invention contributes to its low cost, high reliability, and generally successful operation.

It is thus an object of the present invention to provide apparatus and method for generating an output signal representative of a derivative of an input signal.

It is another object of the present invention to provide apparatus and method for generating an output signal representative of the derivative of a slowly varying input signal.

It is yet another object of the present invention to provide an improved method and apparatus for measuring osmotic fragility of red blood cells.

Other advantages and objects of the present invention will become apparent to one of ordinary skill in the art after referring to a detailed description of the preferred embodiments in conjunction with the following drawings.

DESCRIPTION OF THE PREFERRED EMBODIMENTS

Figure 1:
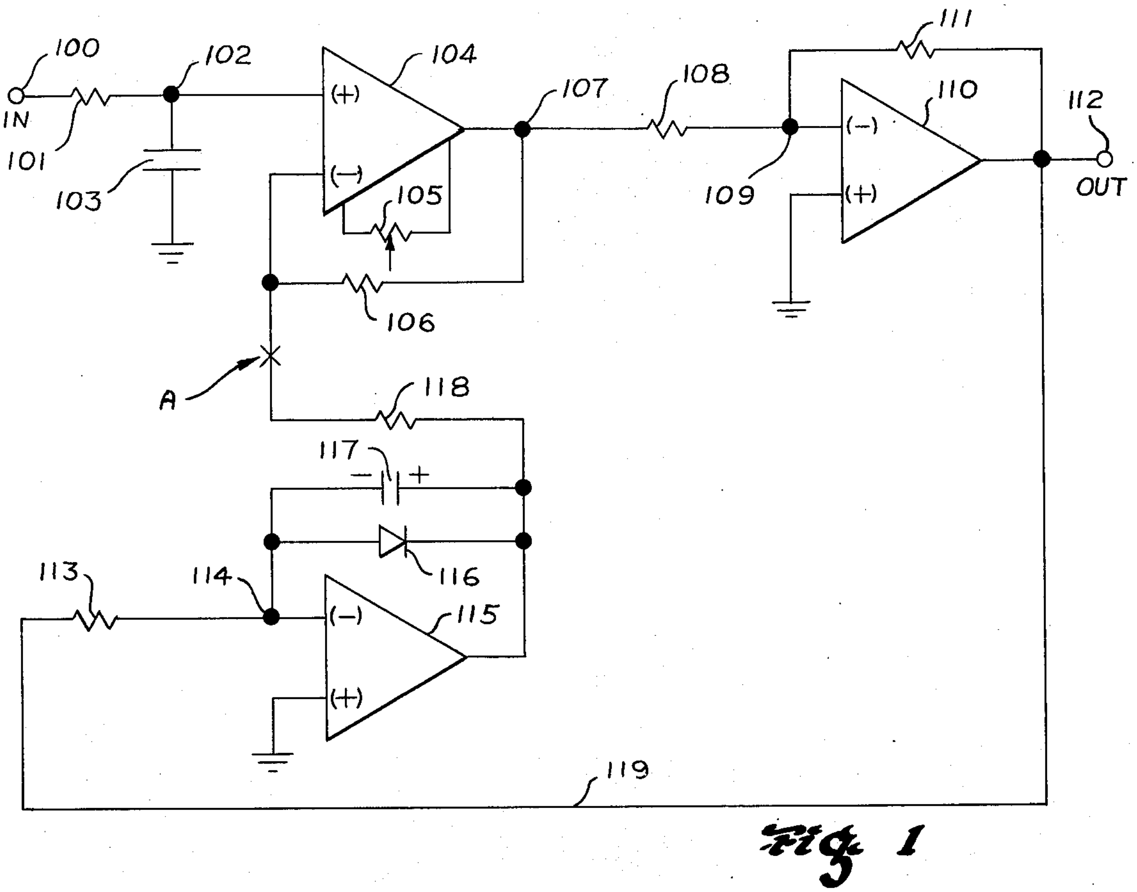
FIG. 1 is an electrical circuit diagram of the preferred embodiment of the present invention; and, FIG. 2 depicts a slowly varying input signal, and its corresponding derivative as generated by apparatus and method of the present invention.

With regard to interconnection of components of FIG. 1, the following three paragraphs provide detailed connections amongst three amplifiers shown: input amplifier 104, output amplifier 110, and feedback (integrator) amplifier 115. The input signal is received at input terminal 100 and its derivative is provided from output terminal 112.

Referring generally to amplifier 104, input terminal 100 is connected to one end of input resistor 101, the other end being connected to one end of filtering capacitor 103 and the non-inverting (plus) input of the amplifier. The other end of capacitor 103 is connected to ground. Potentiometer 105 is interconnected between internal components of amplifier 104 and functions as an offset trim control. When the (+) and (−) inputs are made preliminarily equal, the potentiometer (connected to an unshown source of voltage) is adjusted to make the output zero, prior to operation of the circuit. Feedback resistor 106 is connected between the output of amplifier 104 at junction 107 and the inverting (minus) input of the amplifier. One end of closed-loop or control resistor 118 is also connected to this inverting input. The other end of control resistor 118 is referred to later.

Next, referring generally to amplifier 110, input resistor 108 is connected between junction 107 and the inverting input of amplifier 110. The non-inverting (plus) input of the amplifier is connected to ground. Feedback resistor 111 is connected between the inverting input of amplifier 110 and its output, which is in turn connected to output terminal 112, and via conductor 119 to one end of input resistor 113.

Next, referring generally to feedback integrator amplifier 115, input resistor 113 is connected between conductor 119 and the inverting input of amplifier 115, at summing junction 114. Junction 114 is connected to the anode of diode 116 and one end of capacitor 117, the other end of capacitor 117 and the cathode of diode 116 being connected to the output of amplifier 115, and to the other end of earlier-mentioned closed-loop resistor 118.

Details of operational amplifier connection and operation are sufficiently fundamental to permit omission of a lengthy explanation thereof, without detracting from complete understanding of the operation of the present invention. It is clear to those skilled in the art that power supply and biasing apparatus are employed with operational amplifiers, and elimination of the detail of these connections, and their connections to ground reference potential, does not detract from complete understanding of the present invention. Gain and stability of an operational amplifier are primarily determined by arrangement and values of components interconnected with the amplifier. Typical operational amplifier operation, which generally includes feedback from output to either the input signal terminal or the non-input signal terminal, is based on a fundamental principle of operational amplifier feedback theory: i.e., the two input terminals are constrained to be substantially equal in potential. Thus, if a non-inverting input (+) is grounded, the input signal terminal inverting input (−) tends to become a virtual ground, where the gain is determined by values of amplifier input and feedback impedances or resistors. Furthermore, by use of capacitor means, an operational amplifier may be designed to operate as an integrator etc., as will be described below.

In operation, initially imagine that the conductor at point A is disconnected whereby current does not flow through closed-loop resistor 118. Also, consider that the input signal to input terminal 100 is constant (DC) voltage. These assumptions are initially made for purposes of clarity of illustration of operation and closed loop operation will be described later.

DC input voltage is extended to the non-inverting input of amplifier 104. Amplifier 104 provides non-varying output voltage determined by values of resistors 106 and 101. Feedback resistor 106 provides feedback voltage (or current) to the inverting input of amplifier 104. As noted earlier, due to a fundamental operational characteristic of amplifiers of this type, voltage difference between the two input terminals approaches zero.

Output voltage of amplifier 104 is extended to resistor 108 and to inverting input of amplifier 110. Output of amplifier 110 amplifies to an amount determined by values of resistors 111 and 108 and provides DC output voltage on terminal 112. Output voltage from terminal 112 is extended by conductor 119 to inverting input of amplifier 115. Components associated with amplifier 115, namely input resistor 113 and feedback capacitor 117 cooperate with feedback amplifier 115 to function as an intergrator. Diode 116 provides a clamping function; the output voltage cannot be less than voltage at the inverting input by more than the forward voltage drop of diode 116. The circuit would work without the diode, but is employed as a capacitor-protector in the preferred embodiment since capacitor 117 is selected from the polarized tantalum type, polarity being indicated in FIG. 1.

Because amplifier 115 and its associated components operate as an integrator, output voltage thereof represents an integral of input voltage. Thus, for a DC input voltage, the output linearly and continuously increases (up to a maximum defined by constraints of the circuit biasing apparatus). Thus, for the non-closed loop situation presently being described, constant input voltage results in continuously increasing output voltage from amplifier 115 on capacitor 117. (By comparison, if input voltage to amplifier 115 was zero volts, then capacitor 117 would support a DC voltage, constant in time, which represents an amount of input voltage that had been integrated up to that point in time.)

Now, to achieve the intended closed-loop operation of the circuit apparatus of the present invention, consider the conductor at point A to be connected as shown so that current can flow through control resistor 118. At the moment this connection is made, input voltage or current to inverting input terminal of amplifier 104 is supplied from two resistors, resistor 106 and resistor 118. Output of amplifier 104, previously a constant voltage value, momentarily continues to supply current through first feedback means comprising resistor 106; and, voltage output from amplifier 115 on capacitor 117 begins supplying current through resistor 118 comprising the second feedback means. These two feedback means cooperate by combining currents to the inverting input of amplifier 104 permitting this now dynamic situation to seek a new static or equilibrium point, whereby the desired zero derivative output signal corresponding to the DC input signal is provided as follows.

Voltage between the two input terminals of amplifier 104 tend not to be unequal, as noted above. Feedback resistor 106 alone provided for this result when the conductor at point A was imagined to be broken. Voltage or current supplied from capacitor 117 (output voltage of amplifier 115) through resistor 118 was and still is increasing by virtue of the fact that amplifier 115 is integrating a non-zero voltage at its input, derived from the finite output voltage from amplifier 104. But now, the signal at the inverting input of amplifier 104 is maintained constant by an increasing current flow via resistor 118 and a concomitant decreasing supply of current through feedback resistor 106 as the output of amplifier 104 decreases, in turn causing the integrator amplifier 115 to increase its output more and more slowly. Eventually, all current to the inverting input of amplifier 104, which is required to balance the (DC) input signal on the non-inverting input of that amplifier, is derived via control resistor 118 from feedback or integrator capacitor 117, and none of that current is derived from the output of amplifier 104. Output of amplifier 104 thus becomes zero, whereby output of amplifier 110 becomes zero, whereby the input to amplifier 115 becomes zero. Since amplifier 115 with capacitor 117 and resistor 113 integrate its input voltage, zero voltage input thereto results in constant voltage output. The circuit apparatus of the present invention has thus arrived at a new static or equilibrium condition where input voltage is constant, output voltage (derivative of the input) is zero, and non-inverting input is balanced by current or voltage derived from capacitor 117. Output of the circuit provides an indication that the slope of the input is zero, which is what is required from a derivative circuit operating upon a DC input signal. In other words, if resistors 101 and 118 are equal in resistance value, because of closed loop operation voltage on capacitor 117 is forced to be equal to input voltage at terminal 100 in order to provide equal input currents to amplifier 104. The foregoing description of operation employed a non-varying or DC input signal.

Next, consider the closed loop situation again, but with a varying input voltage having constant slope, and changing, for example, in a positive direction. Output from amplifier 104 tends to vary positively (have positive slope) as well, because the input voltage is received on the non-inverting input terminal. This input-amplifier output voltage is simultaneously fed back through resistor 106 to the inverting input and fed forward to the input of output-amplifier 110. The output from amplifier 110 tends to decrease, since its input was received on an inverting input terminal; this output is indicative of a finite positive slope of input voltage. This output-amplifier output voltage is, of course, fed to the inverting input of feedback amplifier 115. The fact of negative-going non-zero input voltage to amplifier 115 causes integrator-amplifier 115 to change its output voltage, (as long as non-zero input voltage to amplifier 115 exists) in a positive direction, since amplifier 115 receives its input on the inverting terminal. The larger the magnitude of the input, the more rapid the change in output voltage of amplifier 115. The change in voltage across capacitor 117, in response to finite voltage at the input of amplifier 115, is impressed by way of resistor 118 to (or is converted to current by resistor 118 and supplied to) the inverting input of amplifier 104, thus tending to reduce current through feedback resistor 106 as earlier described in the static input voltage signal situation. However, if the input voltage signal at terminal 100 remains increasing (finite slope) then this circuit operation is maintained. In other words, if a signal with non-zero slope exists at terminal 100 then non-zero voltage exists at the input to feedback amplifier 115, and a changing voltage (which tends to "chase" the input voltage at terminal 100) exists across capacitor 117 and is impressed at the negative input of amplifier 104. Output of amplifier 110 is maintained constant, providing the constant derivative of a constant slope input signal. As noted earlier, voltage across capacitor 117 is forced, or tends to be forced, to or towards the value of voltage at the input of the circuit. The foregoing considered a closed-loop, constant slope input signal situation.

Finally, consider the input signal to have a varying slope. If the input slope is abruptly instantaneously large, for example, because of dynamics of the closed-loop operation output from terminal 112 will be relatively large; and, voltage on capacitor 117 will be rapidly changing due to its attempt to equal the rapidly changing input signal voltage at amplifier 104. In other words, the more rapidly the input changes (on terminal 100) the greater is the output voltage (on terminal 112) to cause a more rapid charge of capacitor 117, to attempt to cancel the effect of the input change. Therefore, amplitude of output from output-amplifier 110 is proportional to the instantaneous value of slope of the input signal at terminal 100.

Figure 2:
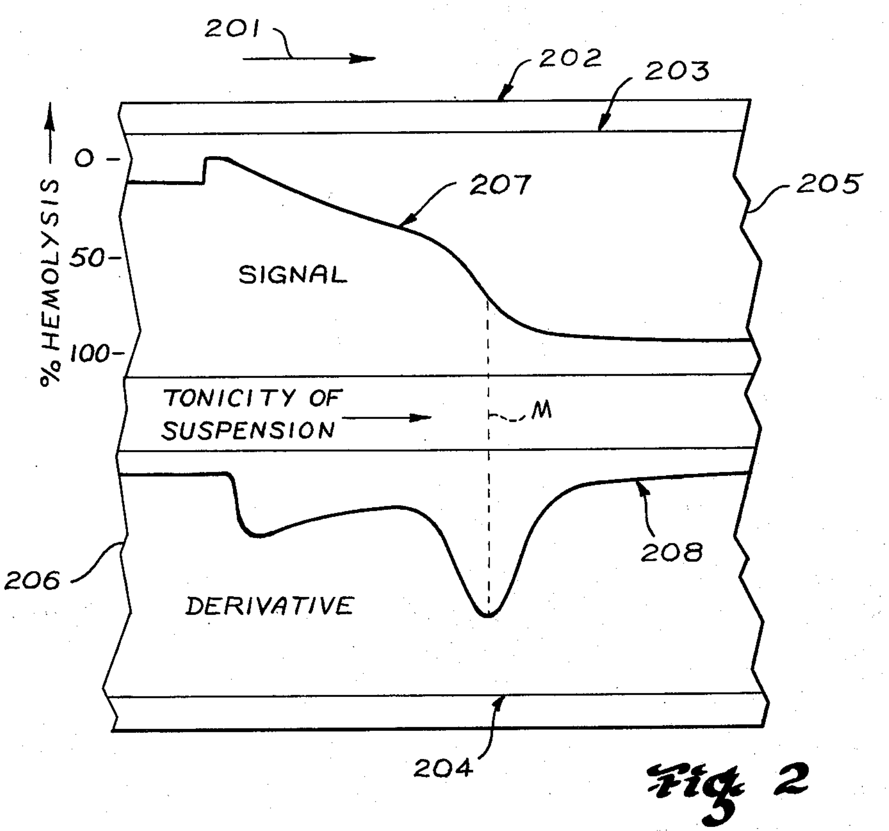

With regard to FIG. 2, numeral 202 represents chart-paper moving in direction 201 at a typical speed of 10 millimeters per minute. The speed can be increased or decreased, and the direction of motion of chart-paper is not limited. Numerals 203 and 204 represent outer boundaries of separate cross-hatch strips both formed on chartpaper 202. The cross-hatching of strips 203 and 204 is not shown and does not detract from understanding the present invention. Signal 207 is a typical organic cell osmotic-profile input signal to be received at input terminal 100 of FIG. 1 and represents in this case a variation of percentage hemolysis of the blood sample as a function of tonicity of suspension of the medium in which the sample is suspended. Information of interest to a physician includes not only amplitude of such a signal, but the point in time when the maximum variation occurs. By use of circuitry apparatus of the present invention in conjunction with apparatus of the incorporated-by-reference patent properties, one obtains signal 208 which is the derivative of signal 207, as shown in FIG. 2. Maximum slope is clearly discernible from derivative signal 208 as indicated by dotted line M, whereas it is not clearly discernible from mere inspection of signal 207. Boundaries 205 and 206 are intended to indicate that the paper can be extended in a direction parallel to direction 201 and only a portion thereof is shown for purposes of clarity of illustration.

A table of component values used in the preferred embodiment of the present invention is presented below:

Table

| Component | Value |
|---|---|
| Resistor 101 | 100K |
| Resistor 106 | 1Meg |
| Resistor 108 | 10K |
| Resistor 111 | 10K |
| Resistor 113 | 1Meg |
| Resistor 118 | 10K |
| Potentiometer 105 | 20K |
| Capacitor 103 | 1.0 uf |
| Capacitor 117 | 100 ufd |
| Diode 116 | 1N914 |
| Amplifier 104 | 741 |
| Amplifier 110 | 741 |
| Amplifier 115 | Teledyne 1421 |

It will be understood by those skilled in the art that other specific configurations, different from that of the preferred embodiment, may be constructed. For example, operational amplifiers could be replaced with discrete component, high-gain, transistorized amplifier circuitry, diode 116 would not be needed and thus could be removed if a polarized capacitor were not used, and other changes could be made. Also, this circuitry is applicable in almost any circumstance where a derivative signal is desired. The circuitry can operate upon signals of both positive and negative slope and polarity, and is not limited to use with apparatus for measuring osmotic fragility of blood samples.

It will be understood by those skilled in the art that operational amplifiers typically have a very high input impedance, and although current flow into operational amplifier input terminals may be finite, it is typically very small. Therefore, one could have described closed loop operation of the present invention in terms of voltages only. For example, it could have been indicated that input signal voltage to the non-inverting (+) input of amplifier 104 may eventually be balanced by feedback voltage derived solely from amplifier 115 and circuitry related thereto, and impressed at the inverting input (−) of amplifier 104 via resistor 118. However, both currents and voltages were used in the earlier description of operation of the present invention for purposes of better clarity of illustration.

Describing overall operation from another viewpoint, it is generally known that current through any ideal capacitor is proportional to time rate of change of voltage thereacross, (the time derivative of voltage). In the present invention, voltage from amplifier 115 and across capacitor 117, through novel arrangement and unique design as previously explained, is forced to follow, chase, tend to equal, or equal input signal voltage at non-inverting input of amplifier 104. Therefore, in view of the current-voltage relationship for a capacitor, current through capacitor 117 is controlled to be at least substantially proportional to a time derivative of this input signal voltage. As noted earlier, input impedances of operational amplifiers are very high. For all practical purposes, current will not flow into the inverting input of amplifier 115; virtually all current conducted through capacitor 117 is conducted through resistor 113. Since the non-inverting input is grounded, as earlier explained, voltage at the inverting input of amplifier 115 is a virtual ground. Voltage applied to resistor 113, which is the system output voltage, must be proportional to current flow through resistor 113. Current flow in resistor 113 is proportional to the time derivative of the system input voltage and therefore the system output voltage is constrained to be proportional to the time derivative of the input voltage.

The present embodiments are to be considered in all respects as illustrative and not restrictive, the scope of the invention being indicated by the appended claims rather than by the foregoing description, and all changes which come within the meaning and range of equivalency of the claims are, therefore, intended to be embraced therein.

What is claimed is:

1. A circuit, capable of use with apparatus that generates at least one slowly varying signal such as a signal generated by organic cells osmotic fragility measuring apparatus, for providing an output signal representative of the derivative of said slowly varying signal, said circuit comprising:

input amplifier means for accepting said slowly varying signal on one input terminal thereof;

output amplifier means responsive to the output of said input amplifier means for providing said output signal;

first feedback means connected between said output of said input amplifier means and another input terminal thereof for providing a first feedback signal; and, second feedback means connected between output of said output amplifier means and said another input terminal of said input amplifier means for providing a second feedback signal, said first feedback means and said second feedback means cooperating to tend to reduce said output of said input amplifier means toward zero whereby said output amplifier provides said output signal.

2. A circuit as recited in claim 1 and wherein each second feedback means comprises:

means for charging a capacitor toward the instantaneous voltage value of said slowly varying signal and for conducting the capacitor voltage to said another input terminal.

3. A circuit as recited in claim 2, and wherein said slowly varying signal is non-varying, whereby said capacitor voltage equals said instantaneous voltage, said output of said input amplifier means is zero, and said output signal is zero signifying a derivative of zero.

4. A circuit as recited in claim 2 and wherein said capacitor charging means comprises an operational amplifier, said capacitor connected between the output and the inverting input of said operational amplifier, means for conducting said output signal to said inverting input, and means for conducting the non-inverting input of said operational amplifier to ground reference potential.

5. A circuit as recited in claim 4 further comprising a diode connected in parallel with said capacitor and poled in a direction to permit flow of current therethrough from said inverting input to said output of said operational amplifier.

6. A circuit as recited in claim 1 and wherein said slowly varying signal changes at a rate of less than one volt per minute.

7. A circuit as recited in claim 6 and wherein said organic cells are red blood cells.

8. A method for taking the derivative of at least one slowly varying signal of the type generated by a process for measuring osmotic fragility of blood cells, said method comprising the steps of:

a. receiving on a first input terminal of an amplifier said slowly varying signal to obtain a first amplified signal;

b. further amplifying said first amplified signal to obtain an output signal;

c. integrating said output signal to obtain an integrated signal; and, d. feeding back said integrated signal together with said first amplified signal to a second input terminal of said amplifier to obtain said derivative of said slowly varying signal.

9. A circuit for providing an output signal representative of the derivative of a slowly varying input signal comprising:

input amplifier means for receiving said slowly varying signal on one input terminal thereof;

output amplifier means responsive to the output of said input amplifier means for providing said output signal; and feedback means connected between the output of said output amplifier means and another input terminal of said input amplifier means for generating another signal substantially equal to said input signal, conducting said another signal to said another input terminal, controlling a current proportional to the time derivative of said another signal, and constraining said output voltage to supply said current.

* * * * *